United States Patent
Lin et al.

(10) Patent No.: US 7,094,705 B2
(45) Date of Patent: Aug. 22, 2006

(54) MULTI-STEP PLASMA TREATMENT METHOD TO IMPROVE CU INTERCONNECT ELECTRICAL PERFORMANCE

(75) Inventors: Keng-Chu Lin, Ping-Tung (TW); Hui-Lin Chang, Hsin-Chu (TW); I-I Chen, Taipei (TW); Yung-Chen Lu, Taipei (TW); Syun-Ming Jeng, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 168 days.

(21) Appl. No.: 10/762,186

(22) Filed: Jan. 20, 2004

(65) Prior Publication Data

US 2005/0158999 A1    Jul. 21, 2005

(51) Int. Cl.
*H01L 21/302* (2006.01)
*H01L 21/461* (2006.01)

(52) U.S. Cl. ...................... 438/710; 438/720
(58) Field of Classification Search ............... 438/622, 438/710, 715, 720, 734, 738, 742
See application file for complete search history.

(56) References Cited

U.S. PATENT DOCUMENTS

| | | | |
|---|---|---|---|
| 6,248,665 B1* | 6/2001 | Bao et al. .................... 438/687 |
| 6,261,951 B1* | 7/2001 | Buchwalter et al. ........ 438/644 |
| 2002/0127840 A1* | 9/2002 | Smith et al. ................ 438/618 |
| 2002/0162736 A1* | 11/2002 | Ngo et al. ............. 204/192.12 |
| 2003/0164354 A1* | 9/2003 | Hsieh et al. .................. 216/22 |
| 2003/0224599 A1* | 12/2003 | Zistl et al. ................... 438/678 |
| 2004/0058528 A1* | 3/2004 | Eissa et al. ................. 438/653 |
| 2004/0152256 A1* | 8/2004 | Noguchi et al. ............ 438/250 |
| 2005/0136644 A1* | 6/2005 | Inukai et al. ............... 438/623 |

* cited by examiner

*Primary Examiner*—Carl Whitehead, Jr.
*Assistant Examiner*—Heather Doty
(74) *Attorney, Agent, or Firm*—Tung & Associates

(57) ABSTRACT

A method for plasma treating an exposed copper surface and dielectric insulating layer in a semiconductor device manufacturing process including providing a semiconductor wafer having a process surface including an exposed copper portion and an exposed dielectric insulating layer portion; plasma treating in a first plasma treatment process, the process surface with a first plasma including ammonia ($NH_3$) and nitrogen ($N_2$) plasma to form a copper nitride layer overlying the exposed copper portion; and, plasma treating in a second plasma treatment process the process surface with a second plasma including oxygen ($O_2$).

22 Claims, 2 Drawing Sheets

MULTI-STEP PLASMA TREATMENT METHOD TO IMPROVE CU INTERCONNECT ELECTRICAL PERFORMANCE

FIELD OF THE INVENTION

This invention generally relates to methods for forming semiconductor device micro-circuitry including copper filled features forming electrical interconnects (lines) and more particularly to a method for plasma treating copper interconnects to improve electrical performance, including cross-interconnect current leakage and copper electro-migration resistance.

BACKGROUND OF THE INVENTION

Copper metallization is increasingly being used for advanced semiconductor device integrated circuit fabrication including semiconductor features having sub-quarter micron linewidths and high aspect ratios to larger features such as bonding pads. Copper and its alloys have lower resistivity and better electromigration resistance compared to other metals such as, for example, aluminum. These characteristics are critical for achieving device reliability together with higher current densities and increased signal propagation speed. While several processing difficulties related to forming copper semiconductor features have been overcome, several problems remain, especially in the areas of current leakage between copper interconnects and the increased tendency of copper to electro-migrate through low-k porous dielectric insulating layers.

In forming a copper semiconductor feature, typically a relatively pure (undoped) copper material is deposited to fill an anisotropically etched opening, to form, for example a copper damascene or dual damascene structure. Copper electro-chemical plating (ECP) is a preferable method for depositing copper to achieve superior step coverage of sub-micron etched features. The deposited copper layer is then planarized to remove excess copper overlying the feature level by chemical mechanical polishing (CMP).

One problem affecting copper metallization is the tendency of copper to easily form oxides of copper, for example $CuO$ or $CuO_2$, upon exposure to oxidizing environments including humid environments. According to prior art processes, following the copper CMP process the exposed copper is protected by depositing overlying layers and/or storing in controlled environments to prevent copper oxidation. The formation of copper oxides increases the electrical resistance of the interconnect lines and reduces adhesion of overlying deposited layers. To form the next level of the device, a metal nitride layer which functions as an etching stop layer in formation of metal interconnect features such as vias or dual damascenes in overlying dielectric insulating layers, is typically deposited over the exposed copper following a CMP process. The overlying etching stop layer is also intended to act to prevent further copper oxidation and to reduce electro-migration of copper.

The dual qoals of preventing copper electro-migration and preventinq cross-interconnect current leakaqe have not been adequately solved for several reasons. For example, porous silicon oxide based low-K dielectric insulating layers having an interconnectinq porous structure have exhibited reduced adhesion to overlying layers, for example etch stop layers, and have increased the tendency of integrated circuit damascene features, such as copper interconnects, to exhibit increased current leakage and electro-migration of copper ions. For example, a phenomenon known as time dependent dielectric breakdown (TDDB) is believed to result from charge accumulation due to slow current leakage over time alonq micro-cracks in the low-K dielectric insulating layers and along cracks developed along poorly adhering material interfaces. As low-K materials become even more porous in an effort to achieve lower dielectric constants, they have coincidentally become increasing mechanically weak, frequently resulting in micro-cracking and poor adhesion at material interfaces thereby increasing both current leakaqe and Cu electromigration. As a result, electrical performance and device reliability of semiconductor devices is compromised.

Thus, there is a continuing need for novel semiconductor micro-circuitry manufacturing methods to improve the electrical performance of copper interconnect features including methods to reduce copper oxidation, improve adhesion of overlying layers, and to mechanically strengthen low-K dielectric insulating layers while maintaining low dielectric constants.

SUMMARY OF THE INVENTION

It is therefore an object of the invention to provide a method for forming copper interconnect features to improve the electrical performance of copper interconnect features including methods to reduce copper oxidation, improve adhesion of overlying layers, and to mechanically strengthen low-K dielectric insulating layers while maintaining low dielectric constants, in addition to overcoming other shortcomings of the prior art.

To achieve the foregoing and other objects, and in accordance with the purposes of the present invention, as embodied and broadly described herein, the present invention provides a method for plasma treating an exposed copper surface and dielectric insulating layer in a semiconductor device manufacturing process.

In a first embodiment, the method includes providing a semiconductor wafer having a process surface including an exposed copper portion and an exposed dielectric insulating layer portion; firstly plasma treating the process surface with plasma including ammonia ($NH_3$) and nitrogen ($N_2$) to form a nitrided copper surface overlying the exposed copper portion; and, secondly plasma treating the process surface with plasma including oxygen ($O_2$).

These and other embodiments, aspects and features of the invention will be better understood from a detailed description or the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary copper interconnect structure (feature) such as a trench line or via, it will be appreciated that the process may be equally as well used in forming copper dual damascene structures as well as thicker and wider structures such as bonding pads and wide trenches. The method is particularly advantageously used in the formation of copper damascene features such as vias and trench lines with linewidths/diameters less than about 0.25 microns, more preferably less than about 0.13 microns. In addition, the method is particularly advantageously used with silicon oxide based low-K dielectric insulating layers having an interconnecting porous structure and having a dielectric constant of less than about 3.0 including less than about 2.5, for example from about 2.2 to about 3.0. It will be understood that the method of the present invention is applicable to the formation of other features having exposed copper surfaces where an overlying nitride or carbide layer is subsequently deposited overlying the exposed copper. Further, the term 'copper' will be understood to include copper and alloys thereof.

For example, in an exemplary embodiment, referring to FIGS. 1A–1D, are shown cross sectional views of a portion of a multi-level semiconductor device at stages in a copper interconnect manufacturing process.

Figure 1A:
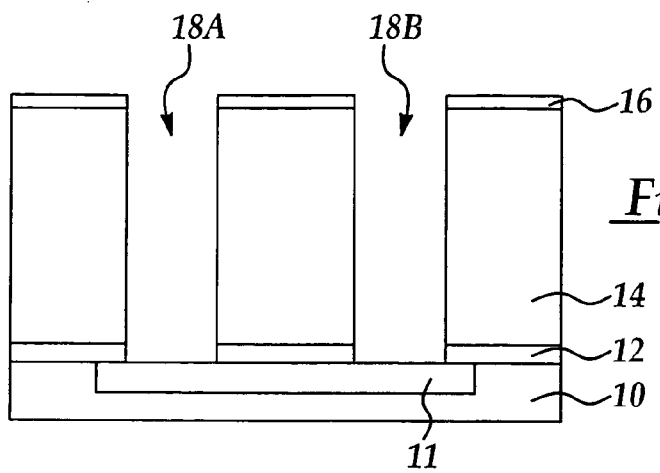
FIGS. 1A to 1D are cross-sectional views of a portion of a multi-layer semiconductor device at stages in a manufacturing process according to an exemplary embodiment of the present invention.
Figure 1B:
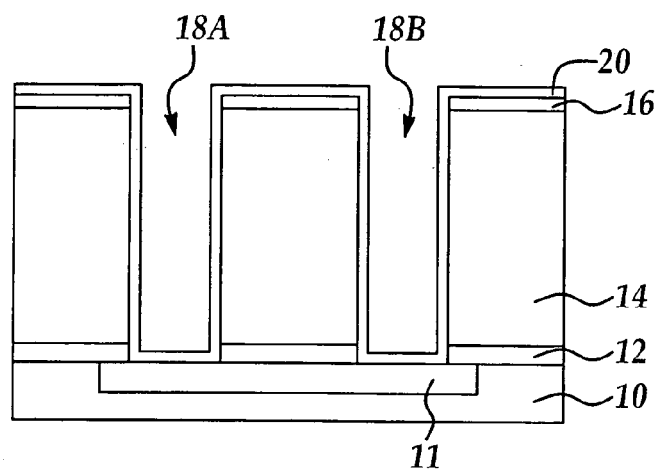

Referring to FIG. 1A, a conductive region 11 formed in a dielectric insulating layer 10 by conventional processes known in the micro-electronic integrated circuit manufacturing process followed by deposition of an overlying first etching stop layer 12, for example, silicon nitride (e.g., SiN, $Si_3N_4$) or silicon carbide (e.g., SiC) to a thickness of about 300 Angstroms to about 700 Angstroms by a conventional CVD, LPCVD, PECVD, and HDP-CVD process.

Still referring to FIG. 1A, formed over first etching stop layer 12 is dielectric insulating layer 14, also referred to as an inter-metal dielectric (IMD) layer preferably formed of a silicon oxide based low-K material having a porous structure, for example an interconnecting porous structure, preferably, carbon doped oxide or organo-silane glass (OSG). The IMD layer 14 preferably has a dielectric constant of less than about 3.0, preferably less than about 2.5. For example, the overall pore volume of the dielectric insulating layer may be from about 20% to about 60% pore volume with respect to any selected IMD layer volume portion. It will be appreciated that the dielectric constant may vary through the dielectric layer thickness. For example, a PECVD process using organo silane and/or organo-siloxane precursors is carried out by known methods to produce the IMD layer 14.

It will additionally be appreciated that a second etch stop layer (not shown) similar to etch stop player 12, for example silicon nitride, may be provided overlying a first IMD layer e.g., 14 followed by deposition of a second IMD layer (not shown) in the same manner as the first IMD layer e.g., 14, in order to form a trench line opening overlying one or more via openings to form a dual damascene by known processes. The IMD layer 14 in the exemplary embodiment is formed having a thickness of about 3000 to about 8000 Angstroms.

Still referring to FIG. 1A, a bottom anti-reflectance coating (BARC) layer 16, for example silicon oxynitride is provided over the IMD layer 14 at a thickness corresponding to odd increments of a quarter wavelength of a subsequent photolithographic exposure process to minimize light reflectance from the IMD layer 14 surface.

Still referring to FIG. 1A, via openings e.g., 18A and 18B are formed by a conventional photolithographic patterning and reactive ion etch (RIE) process, preferably, but not exclusively formed having a diameter of less than about 0.25 microns, for example about 0.13 microns or less. The via openings form closed communication with underlying conductive region 11. The via openings e.g., 18A and 18B are then lined with a barrier layer e.g., 20 by a blanket deposition process such as a PVD and/or CVD process, the barrier layer preferably including at least one layer of a refractory metal, refractory metal nitride and silicided refractory metal nitride for example Ti, Ta, TiN, TaN, TiSiN, and TaSiN, more preferably tantalum nitride (TaN). The barrier layer 20 is typically formed at a thickness of about 100 Angstroms to about 300 Angstroms.

Figure 1C:
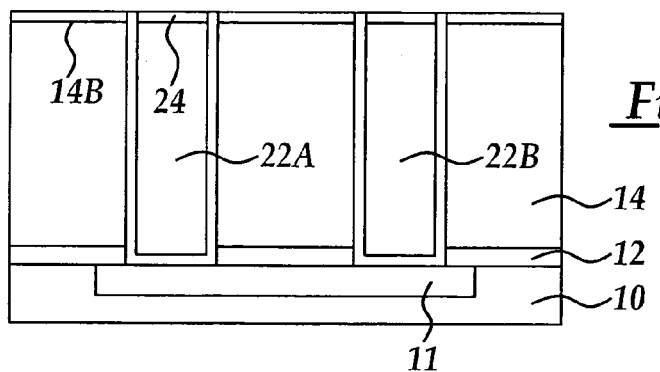

Referring to FIG. 1C, a conventional electrochemical plating (ECP) process is then carried out to fill the via openings 18A and 18B with a blanket deposited copper layer to subsequently form copper filled via portions e.g., 22A and 22B. The ECP copper deposition process is preceded by deposition of a copper seed layer (not shown) by conventional processes, for example a PVD process. The copper portion overlying the via opening level is then removed by a conventional CMP process including removing the barrier layer e.g., 20 and the BARC layer 16 overlying the IMD layer 14 to form copper filled via portions 22A and 22B. The exposed IMD layer 14 is then optionally subjected to a conventional oxide buffing process as part of the CMP process.

Following the CMP process, the process wafer is subjected to a multi-step plasma treatment process. The multi-step plasma treatment process is preferably carried out with a conventional PECVD or HDP-CVD tool (reactor), preferably including a decoupled bias source to alter a wafer bias power, including providing zero bias power. However, the multi-step plasma treatment process may also be carried out in any dry plasma reactor including a barrel plasma etcher, parallel plate reactor, downstream etcher, and high density plasma reactors including electron cyclotron resonance reactors, and magnetron reactors. The pressure of the multi-step plasma treatment may vary depending on the reactor used within a range of plasma pressures from about 1 mTorr to about 10 Torr, but is preferably carried out in a PECVD reactor within a range of about 1 Torr to about 10 Torr, more preferably between about 2 Torr to about 8 Torr.

In a first step of the multi-step plasma treatment process, the process wafer including exposed copper portions is subjected to an ammonia/nitrogen ($NH_3/N_2$) containing plasma treatment. Prior to the first plasma treatment, the process wafer including exposed copper surfaces is preferably pre-heated to a temperature of about 200° C. to about 350° C., more preferably about 200° C. to about 300° C. Preferably the wafer temperature is maintained at a temperature of between about 200° C. to about 350° C. during the first plasma treatment. Preferably, $NH_3$ and $N_2$ are individually supplied or premixed to form a plasma source gas mixture having a ratio $NH_3$ to $N_2$ between about 1:5 and about 1:60.

Exemplary operating conditions include an RF power source of about 100 Watts to about 500 Watts with no RF bias power applied to the process wafer during at least the first plasma treatment. The first plasma treatment process is preferably carried out for a period of about 15 seconds to about 90 seconds.

Still referring to FIG. 1C, according to the first plasma treatment, copper oxides present on the exposed copper surface (not shown) are firstly reduced, primarily as a result of the $NH_3$ present and a nitrided copper surface 24 is substantially simultaneously formed as a protective layer over the exposed copper filled via e.g., 22A and 22B surfaces, for example having a thickness from about 10 Angstroms to about 100 Angstroms, depending on plasma treatment conditions. The formation of the protective nitrided copper surface 24 is an important aspect in the method of the present invention since it serves to protect the exposed copper from oxidation and plasma damage in a subsequent oxygen containing plasma treatment. The nitrided copper surface also improves adhesion of a subsequently deposited overlying etch stop layer and improves resistance to copper ion electromigration.

Following the first plasma treatment with an $NH_3/N_2$ containing plasma source gas, a second plasma treatment is carried out as a second step in the multi-step plasma treatment process. The second plasma treatment includes an oxygen containing plasma and is preferably carried out in-situ following the first plasma treatment, but may also be carried out in a separate plasma reactor, however, preferably in-situ with respect to at least a subsequent overlying etch stop layer deposition process explained below. The second plasma treatment preferably includes a plasma source gas including at least $O_2$, for example $O_2$ and a mixture of another oxygen containing gas such as $CO$, $CO_2$ $NO$, $N_2O$, and $O_3$. Most preferably, due to considerations of cost, and ease of use, and effectiveness, a mixture of $O_2$ and $CO_2$ is used as the plasma source gas, for example supplied individually or pre-mixed at ratio of $O_2$ to $CO_2$ of about 1:5 to about 1:20. Exemplary operating conditions for the $O_2$ containing plasma treatment include the process wafer temperature maintained over a temperature range of about 23° C. to about 250° C., with an RF plasma power of about 100 Watts to about 1000 Watts, a wafer bias of about 0 Watts to about 300 Watts, and a plasma treatment time of about 20 seconds to about 160 seconds.

Figure 1D:
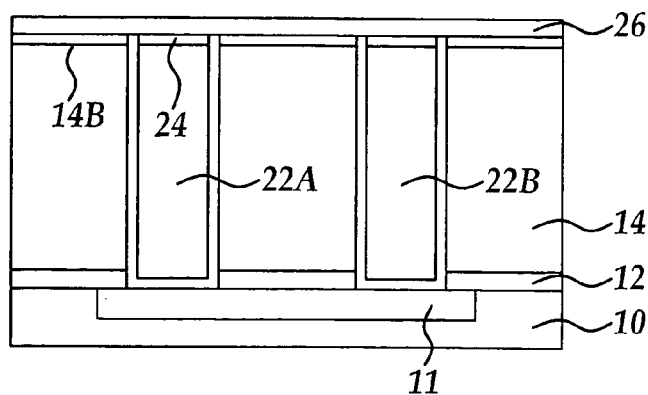

The second plasma treatment with an oxygen containing plasma is an important aspect of the invention since it serves to strengthen the exposed low-K IMD layer interface. Although the precise mechanism is not known for strengthening the IMD layer interface (exposed surface) it is believed that Si—O—Si and/or Si—O—C bonds are created in the near surface region of IMD layer 14, e.g., 14B over a thickness of 5 Angstroms to 50 Angstroms of the exposed IMD layer e.g., 14, acting to densify, e.g., reduce a pore volume of the IMD layer surface to strengthen the near surface region 14B. The degree of pore volume reduction and the thickness of the densified layer will depend in part on the plasma conditions including O2 concentration and time of treatment. As a result, copper electromigration is inhibited and adhesion of the subsequently deposited overlying etch stop layer is improved, thereby reducing electrical current leakage along micro-cracks forming between material interfaces or within the IMD layer. Referring to FIG. 1D, following the multi-step plasma treatment an etch stop layer 26 is blanket deposited over the process surface including the plasma treated IMD layer surface portion 14B and the copper nitride layer 24 to a thickness of about 300 Angstroms to about 700 Angstroms by a CVD process, for example an LPCVD, PECVD, or HDP-CVD process. Preferably the etch stop layer 26 is deposited in-situ with respect to the previous oxygen containing and $NH_3/N_2$ containing plasma treatments, for example carried out in the same PECVD reactor. Preferably the overlying etch stop layer is silicon nitride (e.g., SiN, $Si_3N_4$) or silicon carbide (e.g., SiC), but may be other nitrides or carbides such as silicon oxynitride (e.g., SiON), titanium nitride (e.g., TiN), and silicon oxycarbide (e.g., SIOC).

Thus, a multi-step plasma treatment process has been presented for simultaneously removing copper oxides from an exposed copper surface and forming a protective nitrided copper surface over the exposed copper surface to protect the copper from further oxidation and plasma damage in a subsequent oxygen containing plasma treatment carried out to strengthen a low-K silicon oxide based IMD layer thereby improve adhesion of an overlying etch stop layer and reducing electrical current leakage including TDDB (time dependent dielectric breakdown) and copper electro-migration.

Figure 2:
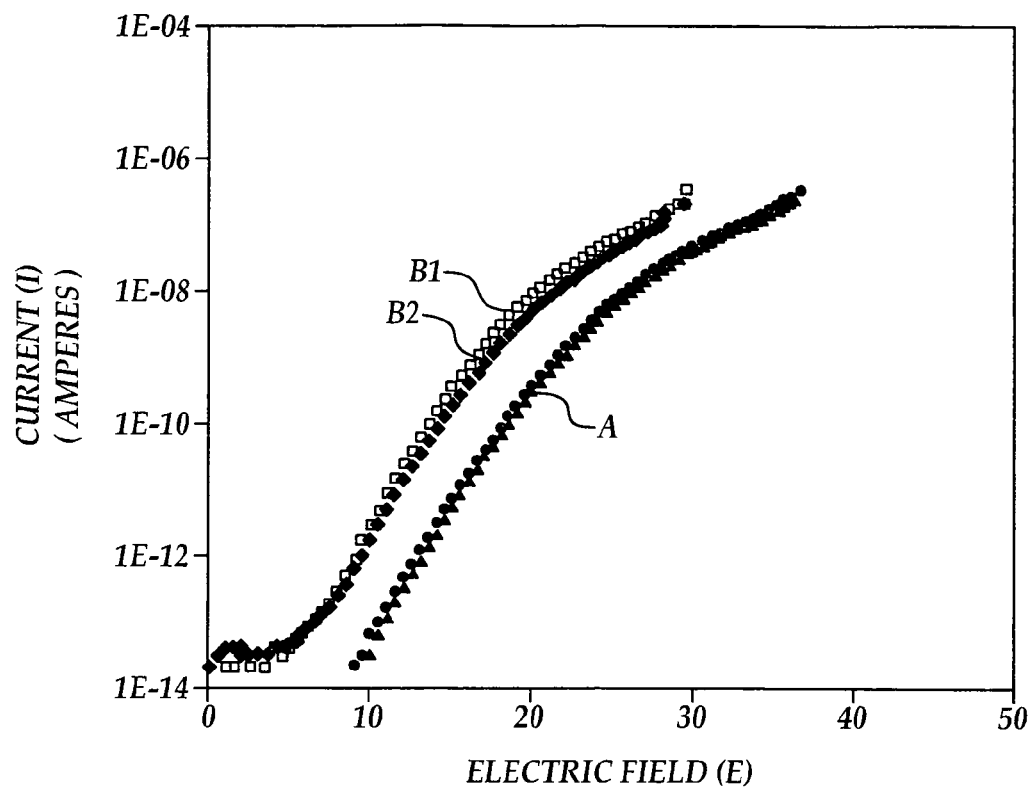
FIG. 2 is a graphical data representation of measured leakage current versus applied electric field carried out on semiconductor device circuitry formed according to preferred embodiments of the present invention.

For example, referring to FIG. 2 is shown representative data depicting a current leakage contribution in a conventional current measurement of copper circuitry (damascenes) forming a portion of a multi-level semiconductor device. Shown on the vertical axis is measured leakage current (I) (Amperes) which includes a leakage current contribution and on the horizontal axis an applied electric field (E) (MV/cm). Data line A represents measured current versus applied electric field for copper damascenes formed according to the preferred embodiments including both the first ($NH_3/N_2$) and second (e.g., $O_2/CO_2$) plasma treatments. Data lines B1 and B2 represents control measurements of copper damascenes formed carrying out only the first plasma treatment ($NH_3/N_2$). It is clearly seen that the second plasma treatment (line A) reduces a leakage current contribution to the measured current at a given applied electric field strength.

Figure 3:
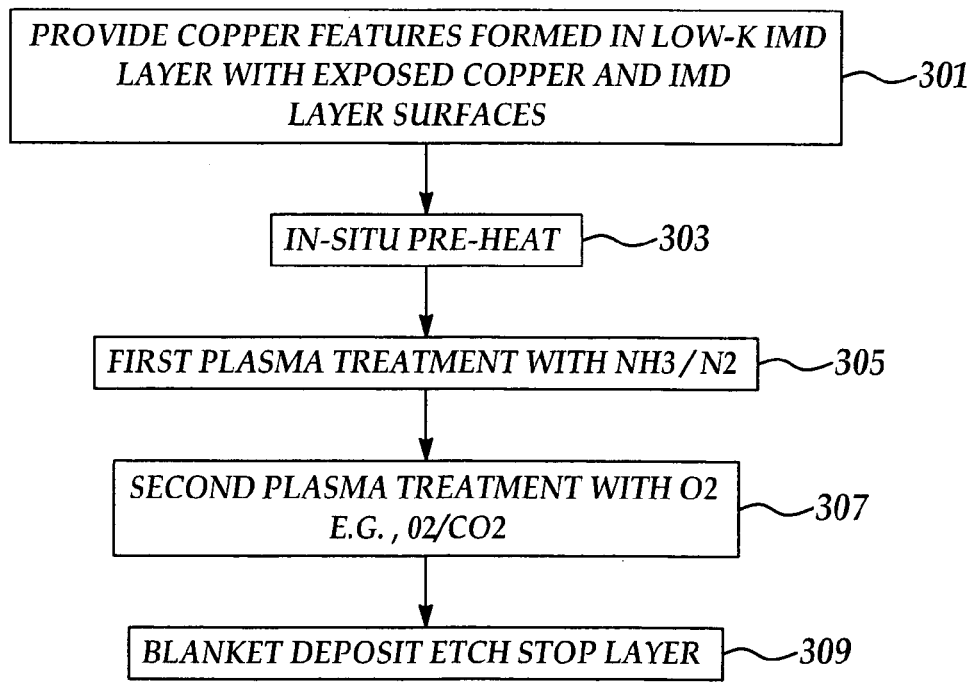
FIG. 3 is a process flow diagram according to the present invention.

Referring to FIG. 3 is a process flow diagram including several embodiments of the present invention. In process 301, a semiconductor process wafer including copper filled features formed in a low-K silicon oxide based IMD layer having exposed IMD layer and copper surfaces is provided. In process 303 the process wafer is subjected to an in-situ pre-heating step prior to a first plasma treatment. In process 305, a first plasma treatment including a plasma source gas mixture of $NH_3/N_2$ is performed at preferred reactor pressures and wafer temperatures to remove copper oxide as well as form a protective copper nitride layer over the copper surfaces. In process 307, a second plasma treatment including an $O_2$ containing plasma source gas is performed at preferred reactor pressures and wafer temperatures to strengthen a near surface region (interface) of the low-K IMD layer. In process 309, an overlying etch stop layer is blanket deposited to cover both the IMD layer and the copper feature.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma treating an exposed copper surface and dielectric insulating layer in a semiconductor device manufacturing process comprising the steps of:

providing a semiconductor wafer comprising a process surface having an exposed copper portion and an exposed dielectric insulating layer portion;

plasma treating the process surface in a first plasma treatment with plasma comprising reduction gas and nitriding gas; and, plasma treating the process surface in a second plasma treatment comprising oxidizing gas, said second plasma treatment performed without deposition of a material layer.

2. The method of claim 1, further including the step of pre-heating the process surface to a temperature of between about 200° C. and 350° C. prior to the first plasma treatment process.

3. The method of claim 1, wherein the reduction gas comprises $NH_3$ and $H_2$.

4. The method of claim 1, wherein the nitriding gas comprises $N_2$, $N_2O$ and $NH_3$.

5. The method of claim 1, wherein the first plasma treatment comprises a plasma gas source comprising a reduction gas to nitriding gas ratio between about 1 to 5 and about 1 to 60.

6. The method of claim 1, wherein the second plasma treatment comprises a plasma gas source comprising $O_2$ and at least one of $O_3$, CO, $CO_2$, NO, and $N_2O$.

7. The method of claim 1, wherein the second plasma treatment comprises a plasma gas source consisting essentially of $O_2$.

8. The method of claim 1, wherein the dielectric insulating layer comprises porous low-k material.

9. The method of claim 8, wherein the dielectric insulating layer comprises a dielectric constant of between about 2.2 and about 3.0.

10. The method of claim 1, further comprising the step of blanket depositing an etch stop layer in an in-situ PECVD process with respect to the second plasma treatment.

11. The method of claim 10, wherein the etch stop layer is selected from the group consisting of silicon nitride, silicon oxynitride, titanium nitride, silicon carbide, and silicon oxycarbide.

12. The method of claim 1, wherein the second plasma treatment is carried out in-situ with respect to the first plasma treatment.

13. The method of claim 1, wherein the first and second plasma treatments are carried out at a pressure between about 1 milliTorr and about 10 Torr.

14. A method for plasma treating a copper interconnect and low-K IMD layer in a semiconductor device manufacturing process comprising the steps of:

providing a semiconductor wafer comprising a copper interconnect formed in an IMD layer comprising porous low-k material wherein a process surface comprising an exposed copper portion and an exposed IMD layer portion;

plasma treating the process surface in a first plasma treatment process with plasma comprising ammonia ($NH_3$) and nitrogen ($N_2$);

then plasma treating the process surface in a second plasma treatment process with plasma comprising oxygen ($O_2$), said second plasma treatment performed without material layer deposition; and, then depositing an etch stop layer over the process surface in a PECVD process.

15. The method of claim 14, further including the step of pre-heating the process surface to a temperature of about 200° C. to about 350° C. prior to the first plasma treatment process.

16. The method of claim 14, wherein the first plasma treatment comprises a plasma gas source comprising an ammonia ($NH_3$) to nitrogen ($N_2$) ratio between about 1 to 5 and about 1 to 60.

17. The method of claim 14, wherein the second plasma treatment comprises a plasma gas source comprising $O_2$ and at least one of $O_3$, CO, $CO_2$, NO, and $N_2O$.

18. The method of claim 14, wherein the second plasma treatment comprises a plasma gas source consisting essentially of $O_2$.

19. The method of claim 14, wherein the IMD layer comprises a dielectric constant of between about 2.2 and about 3.0.

20. The method of claim 14, wherein the step of blanket depositing an etch stop layer is carried out in-situ with respect to the second plasma treatment.

21. The method of claim 14, wherein the etch stop layer is selected from the group consisting of silicon nitride, silicon oxynitride, titanium nitride, silicon carbide, and silicon oxycarbide.

22. The method of claim 14, wherein the second plasma treatment is carried out in-situ with respect to the first plasma treatment.

* * * * *